Feb. 21, 1961 H. E. RUEHLEMANN 2,972,729

SOCKET FOR A PRINTED CIRCUIT AND MOUNTING THEREFOR

Filed Sept. 6, 1957 2 Sheets-Sheet 1

*INVENTOR.*
HERBERT E. RUEHLEMANN
BY Harry Langsam.
Stanley Bilker.
ATTORNEYS

Feb. 21, 1961 H. E. RUEHLEMANN 2,972,729

SOCKET FOR A PRINTED CIRCUIT AND MOUNTING THEREFOR

Filed Sept. 6, 1957 2 Sheets-Sheet 2

*INVENTOR.*
HERBERT E. RUEHLEMANN
BY *Harry Langsam*
*Stanley Bilker*
ATTORNEYS

United States Patent Office 2,972,729

Patented Feb. 21, 1961

2,972,729

SOCKET FOR A PRINTED CIRCUIT AND MOUNTING THEREFOR

Herbert E. Ruehlemann, Huntingdon Valley, Pa., assignor to Elco Corporation, Philadelphia, Pa., a corporation of Pennsylvania Filed Sept. 6, 1957, Ser. No. 682,549

6 Claims. (Cl. 339—193)

My invention relates to an electronic tube socket and mounting therefor, and it is concerned particularly with a socket which is especially suited for use with printed circuits, the socket and its mounting being so arranged as to enable the electronic tube which is held by the socket to lie parallel to the printed circuit panel.

In recent years, printed circuits have come into extensive use, notably in small electronic apparatus such as portable radio receivers, hearing aids, and the like, and also in electronic calculating machine circuits, etc. Printed circuits employ an electrically insulated base or panel upon which strips of electrically conductive materials are deposited or printed to provide for certain components such as connectors, resistors, capacitors, etc., or merely a connecting electrical path. These are usually electrically connected to a tube socket or other electrical components.

There have been proposed, heretofore, several forms of so-called 90° sockets for use with printed circuit boards. Such sockets enable the tubes mounted thereon to lie parallel to the boards and thus conserve space. However, as constructed heretofore, such sockets were relatively expensive and, in some cases, they required careful handling by reason of some of the parts thereof being rather fragile.

The principal object of my invention is to provide an improved 90° socket which is sturdy in construction, yet inexpensive in cost. To this end, I have provided a simplified form of 90° socket in which the support is a stamped metal bracket having legs for mounting the socket upon a mounting board and which also provide a support for insulators which have terminals thereon. The insulators are provided with guide openings for the terminals of the socket contacts.

Another object of my invention is to provide an improved socket contact for a 90° socket wherein the lead wires may be easily pressed through insulators and the mounting board.

Other objects of my invention are to provide an improved device of the character described that is easily and economically produced, which is sturdy in construction, and which is highly efficient in operation.

With the above and related objects in view, my invention consists in the details of construction and combination of parts, as will be more fully understood from the following description, when read in conjunction with the accompanying drawing, in which.

Figure 1:
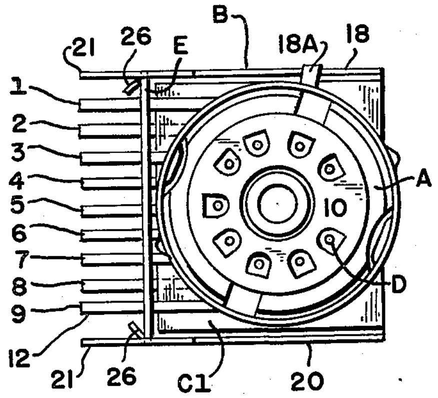
Fig. 1 is a top plan view of the 90° socket structure embodying my invention.
Figure 2:
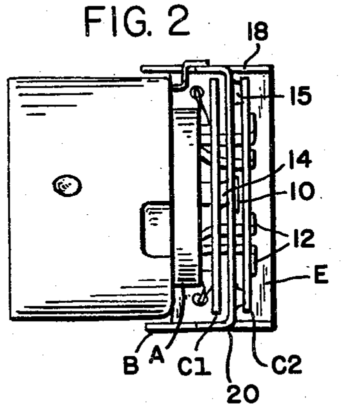
Fig. 2 is a side view of the 90° socket structure shown in Fig. 1.

Referring now in greater detail to the drawings, in which similar reference characters refer to similar parts, I show a socket shell, generally designated as A and having a number of contact receiving cavities thereon. The socket also has a central cavity therein through which eyelet 10 extends for securing the socket A to a single, metal bracket, generally designated as B. Between the socket A and the bracket B is located an insulator sheet, generally desingated as C1, and on the opposite side of the bracket B is a second insulator sheet C2. The insulator sheets C1 and C2 have the same general configuration.

Figure 4:
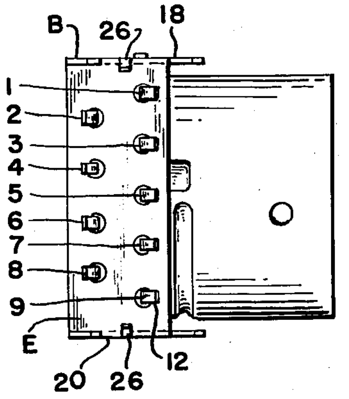
Fig. 4 is a plan view of the terminal board forming part of the socket structure and showing the terminal insertion pattern thereon.
Figure 6:
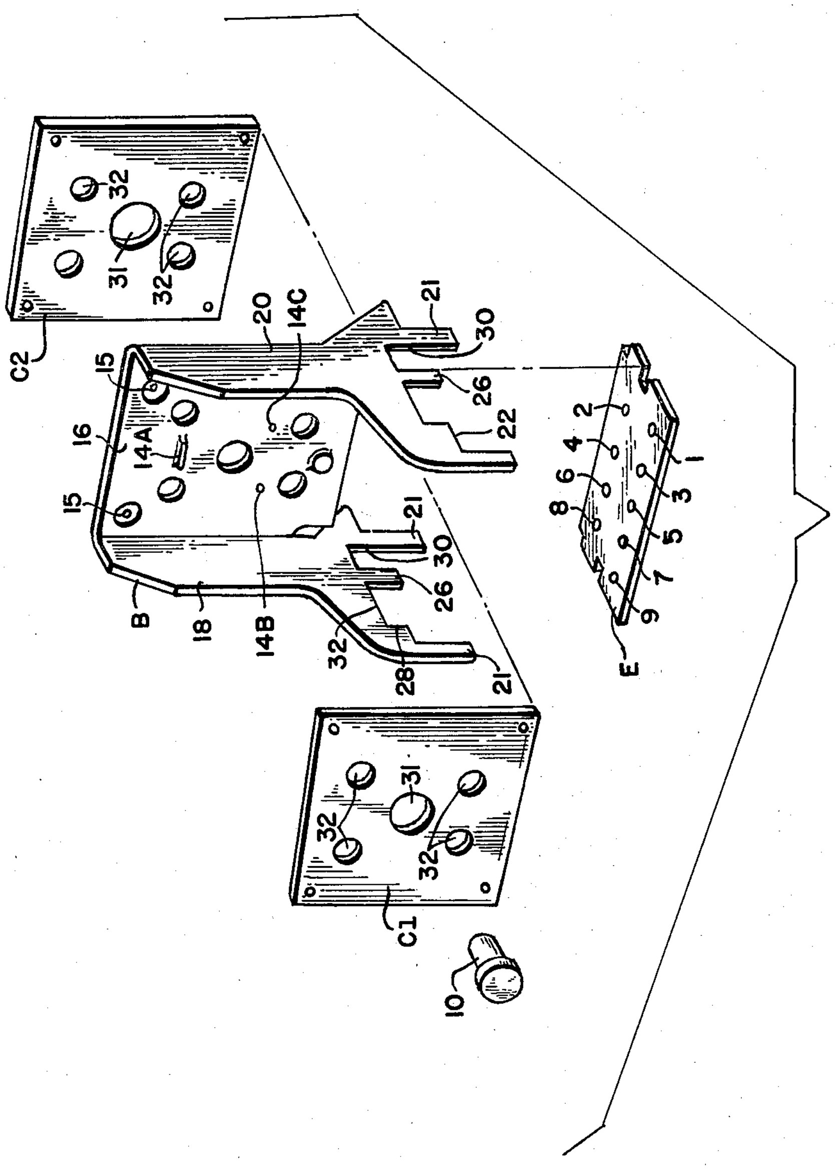
Fig. 6 is an exploded perspective view of certain of the stocket structure parts.

In each of the contact receiving cavities of the socket A is a tube pin receiving contact. Each of these tube receiving contacts, generally designated as D, has an elongated, flat strip or tail 12 integrally formed therewith, the flat strips being adapted to be connected to the printed circuit board. These elongated strips are flexible in order to pass through the socket A, through the flat insulator sheet C1 and an enlarged opening in the metal bracket B, and through an aligned opening in the second flat insulator C2, and then laterally to and through an insulated terminal board, generally designated as E, which serves as an insertion pattern board. The insertion pattern board E is shown in Fig. 4, wherein the flat strips 12 appear along two rows. The flat strips are staggered in relationship to one another in the two rows. The numbering of the strips is as follows: The end strip or terminal at the upper portion of a first row of the pattern board is 1; the end terminal in the other row is 2; the next terminal or strip (reading downwardly in Fig. 4) is in the first row the same as terminal 1, but staggered from terminal 2, and so on. In other words, the terminals numbered along one row are designated by odd numbers and the terminals along the other row by even numbers, but all strips or terminals are staggered with respect to one another alternately in the two rows.

The socket A has a plurality of spaced projections 14 which abut against the first flat insulator C1. The flat insulator C1 has a central opening 31 therein through which the eyelet 10 may pass. A plurality of openings 32 in the insulator C1 circumferentially spaced around the eyelet 10 enable the elongated flat contact strips to pass through the insulator C1.

A second flat insulator board C2, constructed similarly to that of the first flat insulator board C1, has a plurality of circumferentially spaced openings in alignment with the openings of the first flat insulator board and the openings in the bracket B. The flat insualtor boards C1 and C2 are mounted adjacent to the body 16 of the bracket B and parallel thereto. Along the sides of the body 16 and at right angles thereto are projecting flanges 18 and 19, respectively, the flanges being parallel to each other and having a plurality of legs 26 thereon which may be bent to lock the bracket on a printed circuit or other mounting board. The slight off-sets 22 on the legs, determine the limit of penetration of the legs into the mounting board.

The socket A is arranged with its axis perpendicular to the insulator boards C1 and C2 and to the bracket body portion 16. The pattern insertion terminal board E is disposed to one side of the insulator boards C1 and C2 in a plane at right angles to both the parallel planes of the insulator boards C1 and C2 and that of the bracket body portion 16, as well as to the parallel planes of the bracket side flanges 18 and 20. Thus, the board E is parallel to the axis of the socket body A and may be disposed to one side of the socket body. Those contact strips which are even numbered in Fig. 4 pass on to and through the board E to the printed circuit board laterally from the socket body A between the socket body and the first flat insulator board C1, whereas the odd numbered contact or terminal strips 12 pass through the first insulator board C1, the body portion 16 of the bracket, the second insulator board C2, and then laterally of the socket body A on to and through the terminal pattern board E to the printed circuit board.

The printed circuit board (not shown) has a plurality of electro-conductive flat strips which are printed or deposited upon one surface thereof in the usual manner, and the ends of the socket flat strips or terminals 12 may be attached electrically to the printed circuit board. The legs 21 pierce complementary openings in the printed circuit board, and the off-sets 22 limit the piercing of the legs 20 through the board. The legs 21 may then be bent to one side to rigidly hold the bracket in position upon the printed circuit board, and each of the flat strips is electrically connected to it complementary printed circuit flat strip by soldering the flat strips 12 thereto in conventional manner.

Figure 5:
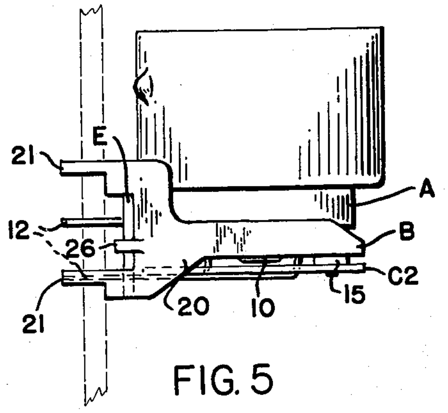
Fig. 5 is an enlarged side elevation of the socket structure.
Figure 3:
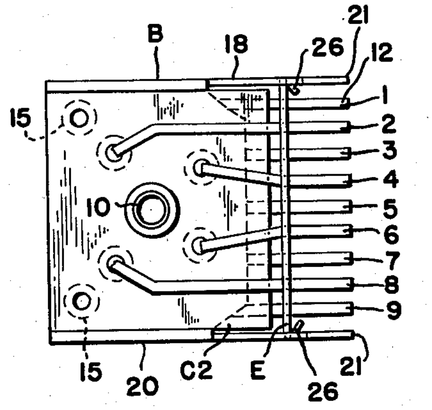
Fig. 3 is a bottom plan view of the 90° socket structure shown in Fig. 1.

The terminal plate E is arranged to lie in the opening between the sides 28 and 30 and to abut the portion of the flange 32. When the extensions 26 are bent over, they underly the front insulation plate to hold it rigidly in position, as is shown in Figs. 3 and 5. It should be noted that the projection 14 keeps the insulator sheet C1 spaced from the bracket, and projections 15, which extend from the portion 16 of the bracket, keep the insulator sheet C2 spaced from the bracket.

From the foregoing description, it is apparent that I have provided an improved socket assembly which enables an electron discharge device to be mounted parallel to the plane of a printed circuit panel or board in a very effective and efficient manner.

Although my invention has been described in considerable detail, such description is intended as being illustrative rather than limiting, since the invention may be variously embodied.

I claim as my invention:

1. A right angle socket structure for electron tubes having terminal pins, said structure comprising a bracket member having a body portion, a pair of electrical insulating means carried by said bracket in spaced relation to opposite sides of said body portion, a socket body connected to said bracket member, a plurality of tube pin receiving contacts carried by said socket body and an electrically insulated terminal board carried by said bracket member at one end of said insulating means, said contacts having terminal strips extending from said socket body, certain of said terminal strips extending laterally of said socket body between said socket body and one of said pair of insulating means to said terminal board, and certain other of said terminal strips extending through said pair of insulating means and thence also laterally of said socket body to said terminal board.

2. A socket structure for electron tubes having terminal pins, said structure comprising a bracket member having a body portion and side portions, a pair of insulator boards mounted on said bracket member between said side portions in spaced relation to each other and to said body portion, a socket body connected to said bracket member, a plurality of tube pin receiving contacts in said socket body, said contacts having terminal strips extending beyond said socket body in the direction of said insulator boards, certain of said terminal strips extending laterally of said socket body between said socket body and a first of said insulator boards, certain other of said terminal strips extending through both said insulator boards and thence also laterally of said socket body, and a terminal board on said bracket member also between said bracket side portions and at one end of said insulator boards, said terminal strips all passing to said terminal board and being so arranged thereon that said first named certain terminal strips lie along a first row on said terminal board in spaced relation to each other along said row, and said second named certain terminal strips lie along a second row on said terminal board in spaced relation to each other along said second row.

3. A socket structure according to claim 2 wherein a plurality of first complementary openings are formed in each of said pair of insulator boards and wherein a plurality of second openings complementary to said first openings but larger than said first openings, are formed in the body portion of said bracket member whereby said first and second complementary openings are aligned to accommodate the passage of said certain other terminal strips.

4. A socket structure for electron tubes having a terminal pins, said structure comprising a bracket member having a body portion and side portions, a pair of insulator boards mounted on said bracket member between said side portions in spaced relation to each other and to said body portion, a socket body connected to said bracket member, a plurality of tube pin receiving contacts in said socket body, said contacts having terminal strips extending beyond said socket body in the direction of said insulator boards, certain of said terminal strips extending laterally of said socket body between said socket body and a first of said insulator boards, certain other of said terminal strips extending through both said insulator boards and thence also laterally of said socket body, and a terminal board on said bracket member also between said bracket side portions and at one end of said insulator boards, said terminal strips all passing to said terminal board and being so arranged thereon that said first named certain terminal strips lie along a first row on said terminal board in spaced relation to each other along said row, and said second named certain terminal strips lie along a second row on said terminal board in spaced relation to each other along said second row, said bracket member side portions are parallel to each other, wherein said pair of insulator boards are parallel to one another and to said bracket body portion, and wherein said terminal board is disposed at right angles to said bracket side portions and also to said pair of insulator boards and said bracket body portion, wherein said socket body is so disposed in relation to said bracket body portion and said pair of insulator boards that the axis thereof is perpendicular to said body portion and to said insulator boards, and said terminal board being so disposed that it is parallel to said axis.

5. A right angle socket structure for electronic tubes having terminal pins, said structure comprising a bracket member having a body portion, a pair of electrical insulating means carried by said bracket in spaced relation to opposite sides of said body portion, a socket body connected to said bracket member, a plurality of tube pin receiving contacts carried by said socket body and an electrically insulated terminal board carried by said bracket member at one end of said insulating means, said contacts having terminal strips which extend laterally from said socket body to said terminal board.

6. A right angle socket structure for electron tubes having terminal pins, said structure comprising a bracket member having a body portion, a pair of electrical insulating means carried by said bracket in spaced relation to opposite sides of said body portion, a socket body connected to said bracket member, a plurality of tube pin receiving contacts carried by said socket body and an electrically insulated terminal board carried by said bracket member at one end of said insulating means, said contacts having terminal strips extending from said socket body, certain of said terminal strips extending laterally of said socket body between said socket body and one of said pair of insulating means to said terminal board, and certain other of said terminal strips extending through said pair of insulating means and thence also laterally of said socket body to said terminal board, said terminal strips being so arranged on said terminal board that said first named certain terminal strips lie along a first row on said terminal board in spaced relation to each other along said row, and said second named certain terminal strips lie along a second row on said terminal board in spaced relation to each other along said second row wherein said terminal strips along said first row are alternately staggered with said terminal strips along said second row.

References Cited in the file of this patent

UNITED STATES PATENTS

| | | |
|---|---|---|
| 2,443,706 | Jansen | June 22, 1948 |
| 2,796,500 | Barden et al. | June 18, 1957 |
| 2,844,807 | McMulkin | July 22, 1958 |
| 2,860,318 | Morone | Nov. 11, 1958 |